(12) United States Patent
Oda et al.

(10) Patent No.: US 12,419,119 B2
(45) Date of Patent: Sep. 16, 2025

(54) SOLID-STATE IMAGING DEVICE

(71) Applicants: TOWER PARTNERS SEMICONDUCTOR CO., LTD., Uozu (JP); TOWER SEMICONDUCTOR LTD., Migdal Haemek (IL)

(72) Inventors: Masahiro Oda, Hyogo (JP); Hiroki Takahashi, Osaka (JP); Hiroyuki Doi, Kyoto (JP); Hirohisa Otsuki, Hyogo (JP)

(73) Assignees: TOWER PARTNERS SEMICONDUCTOR CO., LTD., Uozu (JP); TOWER SEMICONDUCTOR LTD., Migdal Haemek (IL)

( * ) Notice: Subject to any disclaimer, the term of this patent is extended or adjusted under 35 U.S.C. 154(b) by 497 days.

(21) Appl. No.: 17/796,858

(22) PCT Filed: Feb. 19, 2021

(86) PCT No.: PCT/JP2021/006326
§ 371 (c)(1),
(2) Date: Aug. 1, 2022

(87) PCT Pub. No.: WO2021/167060
PCT Pub. Date: Aug. 26, 2021

(65) Prior Publication Data
US 2023/0059212 A1 Feb. 23, 2023

(30) Foreign Application Priority Data
Feb. 21, 2020 (JP) ................. 2020-028024

(51) Int. Cl.
*H10F 39/15* (2025.01)
*H04N 25/79* (2023.01)

(52) U.S. Cl.
CPC ........... *H10F 39/157* (2025.01); *H04N 25/79* (2023.01); *H10F 39/151* (2025.01)

(58) Field of Classification Search
None
See application file for complete search history.

(56) References Cited

U.S. PATENT DOCUMENTS

| 10,128,291 B2 | 11/2018 | Yanagita et al. |
| 2003/0025160 A1 | 2/2003 | Suzuki et al. |

(Continued)

FOREIGN PATENT DOCUMENTS

| JP | H09-186307 A | 7/1997 |
| JP | 2003031785 A | 1/2003 |

(Continued)

*Primary Examiner* — Benjamin P Sandvik
(74) *Attorney, Agent, or Firm* — Maschoff Brennan

(57) ABSTRACT

A solid-state imaging device includes an N-type semiconductor layer, an element layer including a photoelectric conversion element and an active element, an interconnect layer providing an interconnect for the active element, and an element isolation trench penetrating the semiconductor layer. The element layer includes a P-type region and an N-type region. A first hole storage layer is formed on a surface of the semiconductor layer on a side opposite to the element layer. A second hole storage layer is formed in contact portions of the semiconductor layer and the element layer with the element isolation trench. The P-type region of the element layer and the first hole storage layer are connected to each other by the second hole storage layer.

2 Claims, 17 Drawing Sheets

(56) References Cited

U.S. PATENT DOCUMENTS

| | | | | |
|---|---|---|---|---|
| 2009/0130846 A1* | 5/2009 | Mistuhashi | ......... | H01L 21/6835 |
| | | | | 257/E21.597 |
| 2011/0089517 A1* | 4/2011 | Venezia | ................ | H10F 39/026 |
| | | | | 257/443 |
| 2013/0323875 A1* | 12/2013 | Park | .................. | H01L 21/76898 |
| | | | | 438/70 |
| 2014/0054662 A1* | 2/2014 | Yanagita | ........... | H01L 27/14612 |
| | | | | 438/73 |
| 2015/0187826 A1 | 7/2015 | Suzuki | | |
| 2017/0365631 A1 | 12/2017 | Iizuka et al. | | |
| 2018/0197904 A1* | 7/2018 | Oh | ....................... | H04N 25/633 |
| 2018/0286922 A1* | 10/2018 | Togashi | ............ | H01L 27/14638 |
| 2019/0148427 A1* | 5/2019 | Lee | ....................... | H10F 39/813 |
| | | | | 257/446 |

FOREIGN PATENT DOCUMENTS

| | | |
|---|---|---|
| JP | 2009-124087 A | 6/2009 |
| JP | 2017-224741 A | 12/2017 |
| WO | 2012117931 A1 | 9/2012 |
| WO | 2014021115 A1 | 2/2014 |

\* cited by examiner

FIG.4
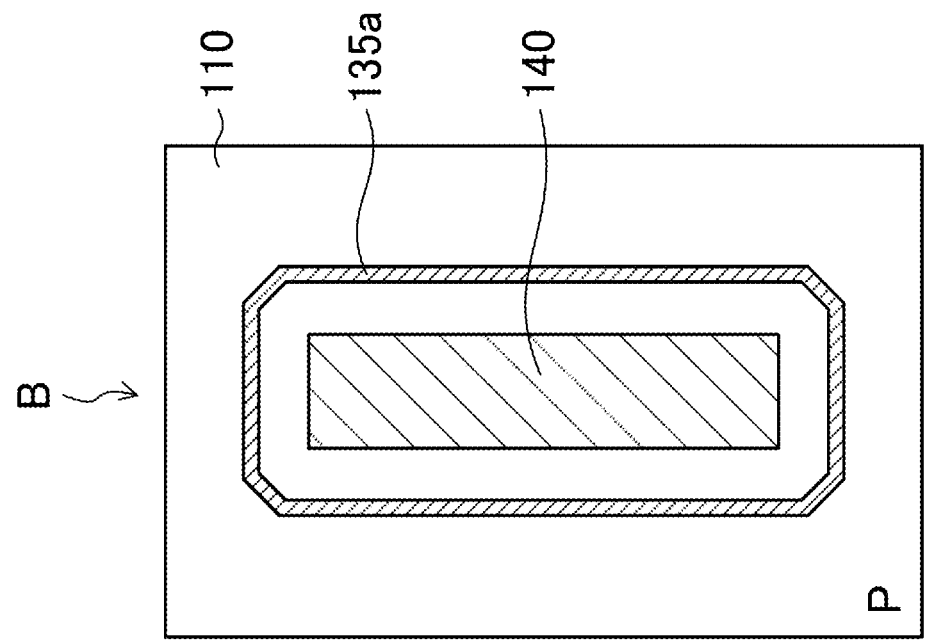
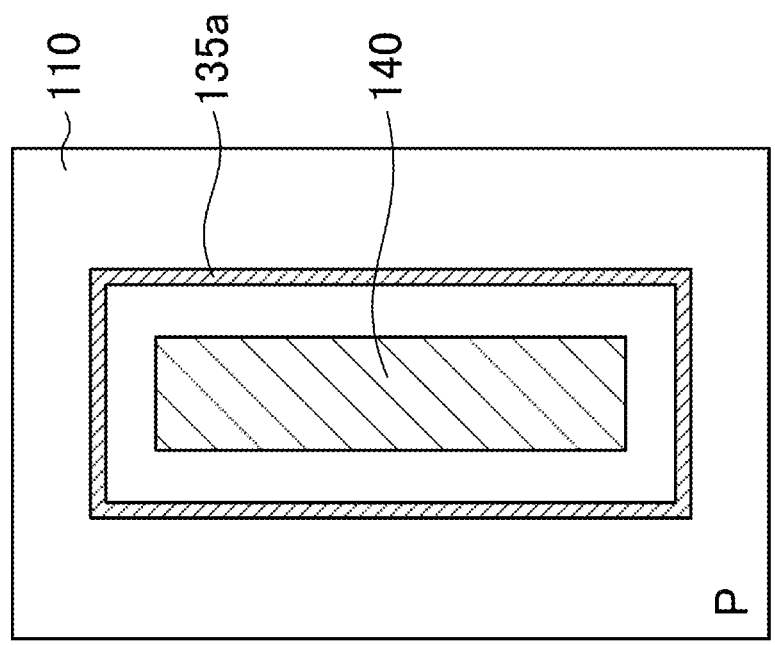

SOLID-STATE IMAGING DEVICE

TECHNICAL FIELD

The present disclosure relates to a solid-state imaging device.

BACKGROUND ART

In recent years, a lot of image sensors with greatly improved sensitivities in an infrared region have been proposed. Since silicon has a lower infrared absorption sensitivity, extending the distance through which infrared rays pass through a silicon substrate is effective in improving the sensitivity. For this reason, a lot of techniques of forming a thick silicon substrate have been proposed.

On the other hand, a backside illumination image sensor has been proposed as a technique of improving the sensitivity. This image sensor allows the entry of light from the surface opposite to a surface on which an active element is formed. Patent Document 1 discloses a technique of forming a p-type layer on the back surface and fixing the potential via a deep p-type well from the front surface to reduce a dark current on the back surface.

CITATION LIST

Patent Document

Patent Document 1: Japanese Unexamined Patent Publication No. 2003-31785

SUMMARY OF THE INVENTION

Technical Problem

However, with an increase in the thickness of the silicon substrate to improve the infrared sensitivity, extending the deep p-type well region to the back surface becomes difficult. As a result, the potential of the p-type layer on the back surface cannot be fixed, whereby increasing the dark current.

In view of the forgoing, it is an objective of the present disclosure to provide an imaging device capable of providing excellent image quality without degrading a dark current even with an increase in the thickness of a silicon substrate of a backside illumination image sensor to improve infrared sensitivity.

Solution to the Problem

A solid-state imaging device according to the present disclosure includes a pixel array of a plurality of unit pixels. Each of the plurality of unit pixels includes a photoelectric conversion element that generates a signal charge by photoelectric conversion, and an active element that converts the signal charge into an electric signal and outputs the electric signal. The solid-state imaging device includes: an N-type semiconductor layer; an element layer stacked on the semiconductor layer and including the photoelectric conversion element and the active element; an interconnect layer stacked on the element layer and providing an interconnect for the active element; and an element isolation trench penetrating the semiconductor layer. The element layer includes a P-type region and an N-type region. A first hole storage layer is formed on a surface of the semiconductor layer on a side opposite to the element layer. A second hole storage layer is formed in contact portions of the semiconductor layer and the element layer with the element isolation trench. The P-type region of the element layer and the first hole storage layer are connected to each other by the second hole storage layer.

Advantages of the Invention

The solid-state imaging device according to the present disclosure reduces an increase in a dark current even with an increase in the thickness.

BRIEF DESCRIPTION OF THE DRAWINGS

FIG. 4 includes plan views schematically illustrating shapes of a near-via DTI region in the solid-state imaging device in FIG. 3.

DESCRIPTION OF EMBODIMENTS

Embodiments of the present disclosure will be described below with reference to the drawings.

First Embodiment

Figure 1:
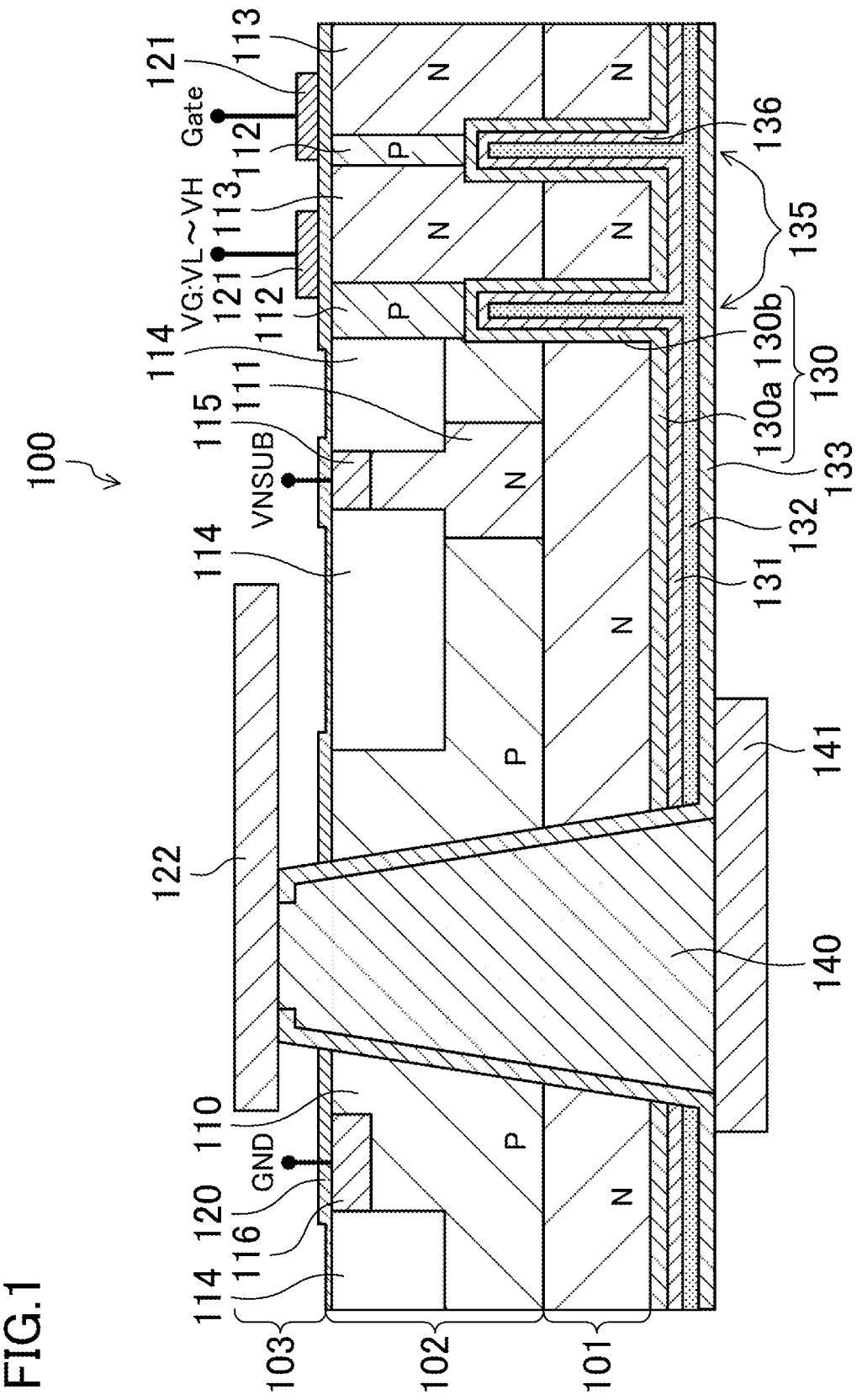
FIG. 1 is a schematic cross-sectional view of a solid-state imaging device according to a first embodiment.

FIG. 1 schematically shows a cross section of a main part of an exemplary solid-state imaging device 100 according to a first embodiment of the present disclosure.

The solid-state imaging device 100 includes an N-type semiconductor layer 101, an element layer 102 stacked thereon and including a photoelectric conversion element and an active element, and an interconnect layer 103 stacked thereon and providing an interconnect for the active element and other elements. In the solid-state imaging device 100, incident light enters the element layer 102 from the side close to the N-type semiconductor layer 101, that is, opposite to the interconnect layer 103.

The N-type semiconductor layer 101 and the element layer 102 are formed using an N-type epitaxial layer on an N-type semiconductor substrate (not shown). The element layer 102 is obtained by forming P-type and N-type regions and an insulating layer in an upper region of the N-type epitaxial layer. A region of the N-type epitaxial layer below the element layer 102 serves as the N-type semiconductor layer 101. This is an example, and the method of forming the N-type semiconductor layer 101 and the element layer 102 is not particularly limited.

The element layer 102, more specifically, a P-type well region 110, an N-type well region 111, a P-type layer 112, photodiodes 113 which are N-type regions, a high-concentration N-type layer 115, and a high-concentration P-type layer 116 are formed by impurity injection, for example. In addition, shallow trench isolation (STI) regions 114 which are element isolation trenches are obtained by forming trenches penetrating the N-type semiconductor layer 101 and removing parts of the element layer 102, and filling the trenches with impurities.

The photodiodes 113 perform photoelectric conversion using incident light and generate signal charges. The active element including the N-type well region 111 and other regions converts the signal charges generated by the photodiodes 113 into electric signals, and outputs the electric signals. Unit pixels include the photodiodes 113 and the active element. The unit pixels are arranged in a matrix into a pixel array. In addition, a circuit isolated by the P-type well region and the N-type well region is provided on a periphery of the pixel array.

Located on the element layer 102 is the interconnect layer 103 including an on-element insulating film 120 and a transfer gate 121 on the on-element insulating film 120.

A deep trench isolation (DTI) region 135 which is an element isolation trench penetrating the N-type semiconductor layer 101 is provided. The DTI region 135 reaches the P-type layer 112 of the element layer 102 from the surface opposite to the element layer 102. The DTI region 135 is obtained by forming a trench 136 with a depth that allows penetration through the N-type semiconductor layer 101 and cutting of part of the element layer 102, and filling the inside of the trench 136 with the first insulating film 132.

Before filling with the first insulating film 132, a metal oxide film 131 made of hafnium-dioxide ($HfO_2$) or aluminum-oxide ($Al_2O_3$) is formed to cover the sidewalls and the bottom surface of the trench 136.

The metal oxide film 131 covers the inside of the trench 136 and the surface of the N-type semiconductor layer 101. Accordingly, the first insulating film 132 fills the inside of the trench 136 with the metal oxide film 131 interposed therebetween. The first insulating film 132 covers the metal oxide film 131 outside the trench 136, as well. A second insulating film 133 covers the insulating film 132.

In the metal oxide film 131, negative fixed charge is generated on a side facing the N-type semiconductor layer 101 and the element layer 102. Accordingly, holes are supplied from a GND terminal through the P-type well region 110 to contact portions of the N-type semiconductor layer 101 and the element layer 102 with the metal oxide film 131, where the holes are stored to form a P-type hole storage layer 130. More specifically, a first hole storage layer 130a is formed along the surface of the N-type semiconductor layer 101 on the side opposite to the element layer 102, and a second hole storage layer 130b is formed on the bottom surface and sidewall of the trench 136.

A via (i.e., a through-silicon via (TSV)) 140 penetrating the N-type semiconductor layer 101 and the element layer 102 is formed. The via 140 is insulated from the N-type semiconductor layer 101 and the element layer 102 by the second insulating film 133. The via 140 is connected to a copper interconnect 122 on the side closer to the interconnect layer 103, and to an electrode pad 141 on the side closer to the N-type semiconductor layer 101.

In the solid-state imaging device 100 according to the present disclosure described above, the P-type region (e.g., the P-type layer 112) in the element layer 102 and the first hole storage layer 130a which is the P-type region on the side of the N-type semiconductor layer 101 opposite to the element layer 102 are electrically connected to each other by the second hole storage layer 130b along the DTI region 135. Even with an increase in the thickness of the N-type semiconductor layer 101, holes are thus supplied through the second hole storage layer 130b on the sidewalls of the DTI region 135, thereby making it possible to reduce an increase in a dark current.

Figure 2:
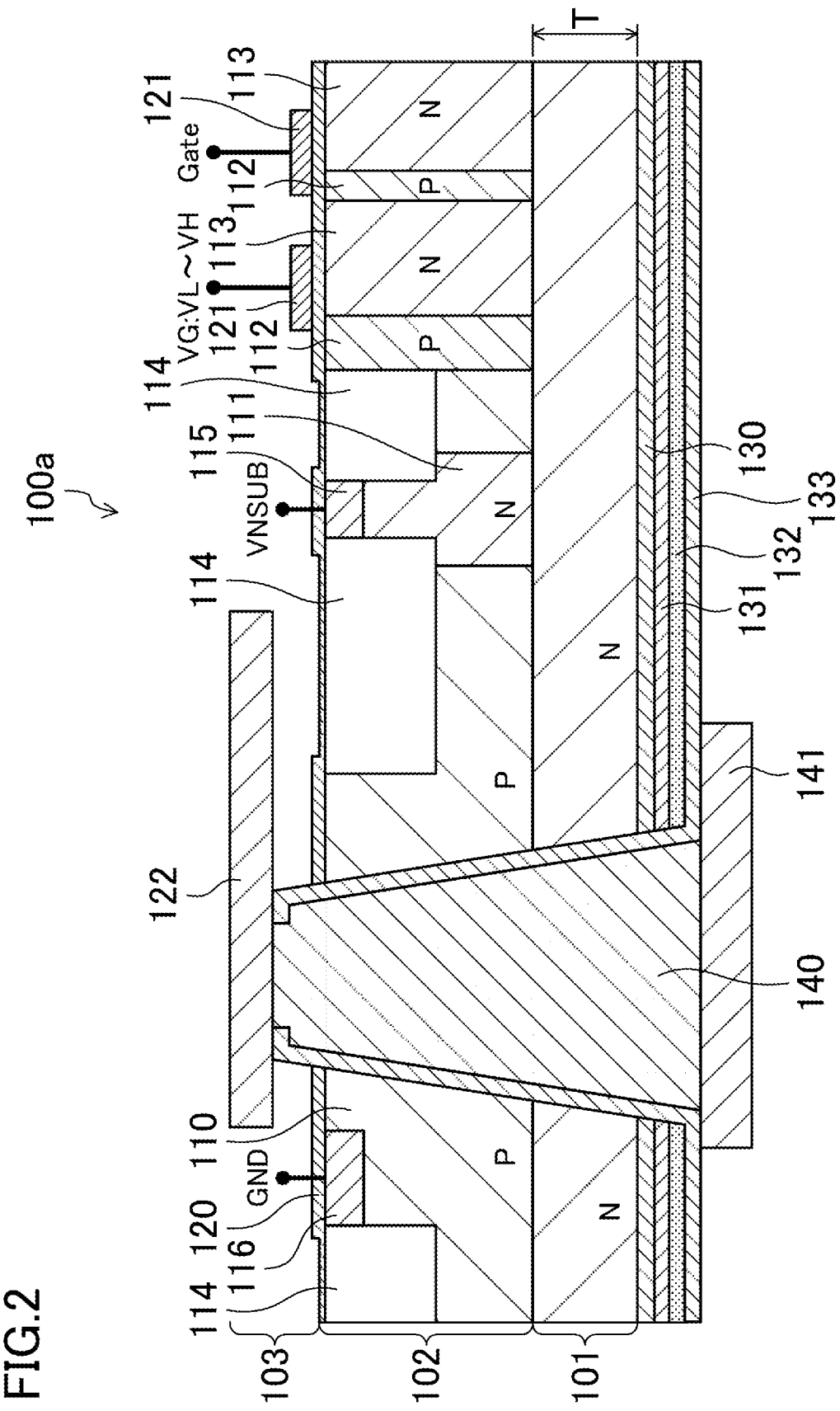
FIG. 2 is a diagram illustrating a solid-state imaging device according to a comparative example.

FIG. 2 shows a solid-state imaging device 100a according to a comparative example, which corresponds to the solid-state imaging device 100 without the DTI region 135. If the solid-state imaging device 100a includes an N-type semiconductor layer 101 with a sufficiently small thickness T, a deep P-type well region can be formed from the side closer to the element layer 102 by impurity injection or other methods, and extend to the surface (i.e., the back surface) opposite to the element layer 102. In this case, the potential of the P-type layer on the back surface can be fixed.

However, with an increase in the thickness T of the N-type semiconductor layer 101 to improve infrared sensitivity, forming the P-type well region to the back surface becomes difficult. As a result, the potential of the P-type layer on the back surface cannot be fixed, thereby increasing a dark current.

By contrast, in the solid-state imaging device 100 according to the present disclosure shown in FIG. 1, the DTI region 135 is formed from the back surface, and the hole storage layer 130 is formed in the contact portion with the DTI region 135. Even with an increase in the thickness of the N-type semiconductor layer 101, holes are thus supplied through the hole storage layer 130 to the back surface. As a result, an increase in the dark current is reduced, and a captured image has an improved quality.

Second Embodiment

Figure 3:
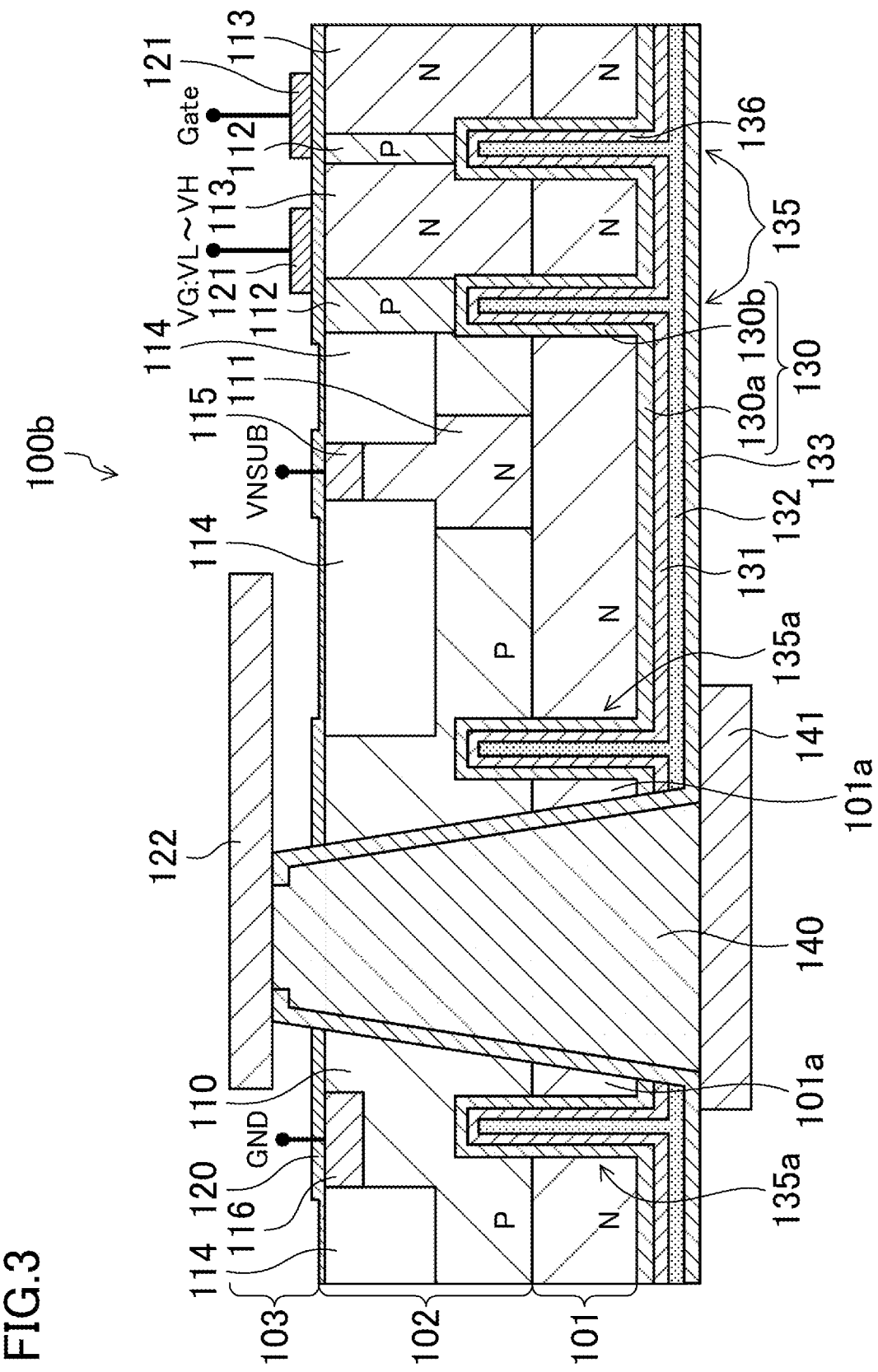
FIG. 3 is a schematic cross-sectional view of a solid-state imaging device according to a second embodiment.

FIG. 3 is a schematic cross-sectional view of a solid-state imaging device 100b according to a second embodiment. The solid-state imaging device 100b is the same as the solid-state imaging device 100 in FIG. 1 except that the solid-state imaging device 100b includes a near-via DTI region 135a around the via 140. Similarly to the DTI region 135 of the solid-state imaging device 100, the near-via DTI region 135a includes an insulating film filling the trench with the metal oxide film 131 interposed therebetween.

FIG. 4 shows, as a plan view, a schematic planar configuration A of the via 140 and the near-via DTI region 135a of the solid-state imaging device 100*b*. As shown here, the near-via DTI region 135*a* surrounds the periphery of the via 140.

The via 140 serves as a TSV penetrating the silicon substrate (or the N-type semiconductor layer 101) to form the electrode pad 141 on the side of the N-type semiconductor layer 101 opposite to the element layer 102. The DTI region 135*a* includes, on a side surface, a p-n junction, which causes a leakage current.

To address this, the near-via DTI region 135*a* surrounds the via 140 in the solid-state imaging device 100*b* according to this embodiment. Accordingly, an N-type semiconductor layer 101*a* around the via 140 is electrically isolated, which reduces the generation of the leakage currents.

A planar configuration B in FIG. 4 is a variation of the layout of the near-via DTI region 135*a*. In the planar configuration A, the near-via DTI region 135*a* has a rectangular shape with each corner bending at an angle of 90°. On the other hand, the planar configuration B has a shape (i.e., an octagon) with each corner bending twice at an obtuse angle (135° in this example) in place of bending each corner of the rectangle at an angle of 90°. The configuration without any part bending at 90° in this manner provides a stable size of the near-via DTI region 135*a* and stable filling characteristics of the first insulating film 132 or other films, when forming the near-via DTI region 135*a*. The shape of the near-via DTI region 135*a* in the plan view is not limited to the octagon shown and may be another shape.

Third Embodiment

Figure 5:
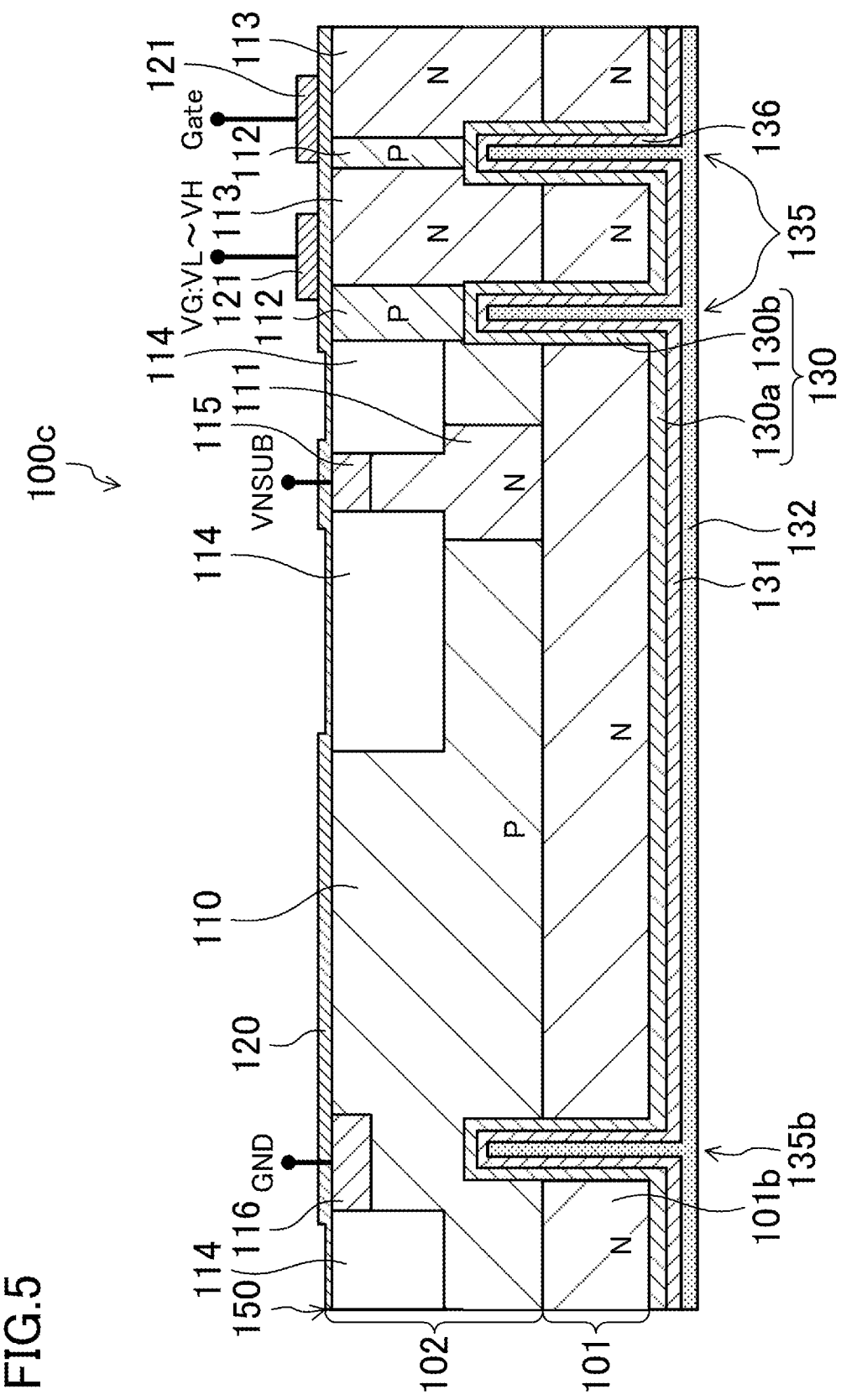
FIG. 5 is a schematic cross-sectional view of a solid-state imaging device according to a third embodiment.

FIG. 5 is a schematic cross-sectional view of an exemplary solid-state imaging device 100*c* according to a third embodiment. As compared to the solid-state imaging device 100 shown in FIG. 1, the solid-state imaging device 100*c* includes none of the via 140, and the copper interconnect 122 and electrode pad 141 connected to the via 140. The solid-state imaging device 100*c* further includes a near-edge DTI region 135*b* with the same or similar structure to that of the DTI region 135.

Figure 6:
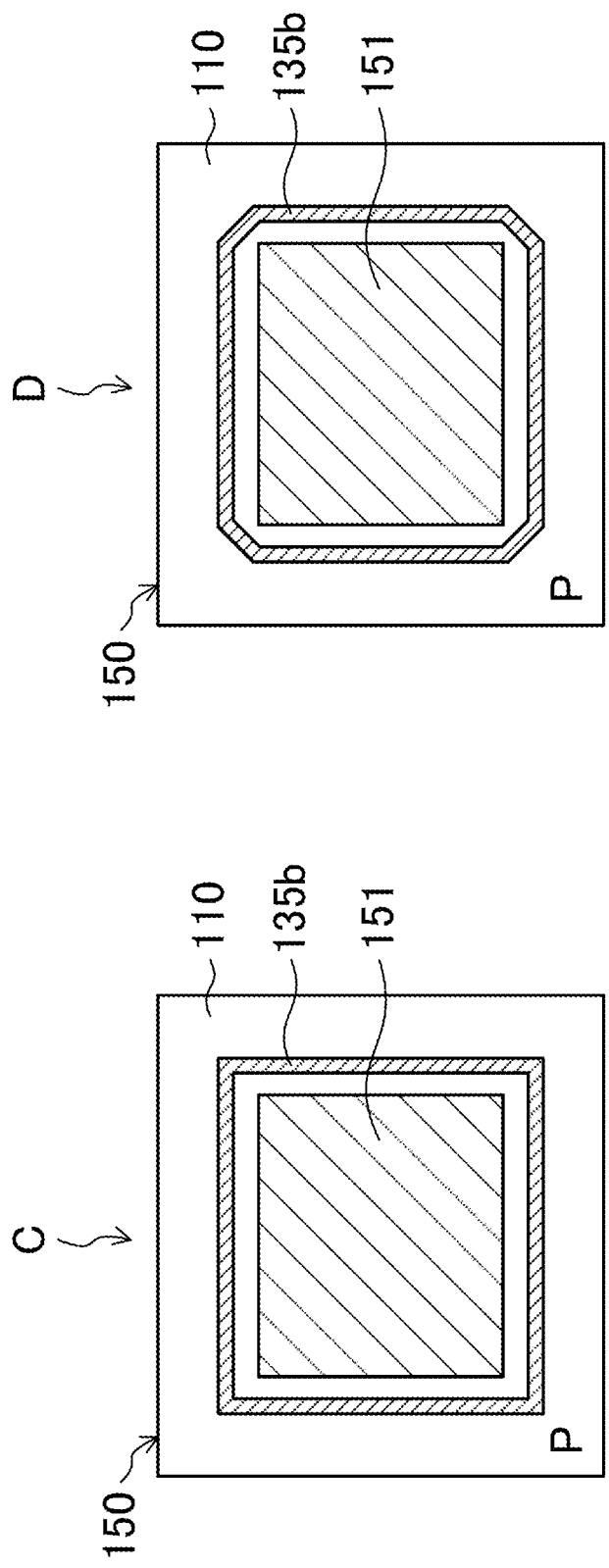
FIG. 6 includes plan views schematically illustrating shapes of a near-edge DTI region in the solid-state imaging device in FIG. 5.

FIG. 6 shows, as a plan view, a schematic planar configuration C of the near-edge DTI region 135*b* of the solid-state imaging device 100*c*, and an internal circuit region 151 surrounded by the near-edge DTI region 135*b*. The internal circuit region 151 includes both an N-type well region and a P-type well region to serve as a photoelectric conversion element and an active element, for example.

In FIG. 5, the left end of the solid-state imaging device 100*c* is a chip end 150 of the solid-state imaging device 100*c* divided (diced) as a chip. The chip end 150 includes p-n junctions at two points, namely, between the P-type well region 110 and the N-type semiconductor layer 101 and between the N-type semiconductor layer 101 and the hole inducing layer 130*a*. These p-n junctions, too, cause a leakage current. To address this, the near-edge DTI region 135*b* is formed in the solid-state imaging device 100*c* at the peripheral edge of the chip so as to be along the chip end 150. The near-edge DTI region 135*b* continuously surrounds the inside region. Accordingly, an N-type semiconductor layer 101*b* near the chip end 150 is electrically isolated, thereby making it possible to reduce an increase in a leakage current.

In a variation, similarly to the near-via DTI region 135*a* shown in the planar configuration B of FIG. 4, the near-edge DTI region 135*b*, too, may include no part bending at an angle of 90° (may include a part bending at an obtuse angle of, for example, 135°). This is shown as a planar configuration D of FIG. 6. Accordingly, the near-edge DTI region 135*b* can be formed stably.

Fourth Embodiment

Figure 7:
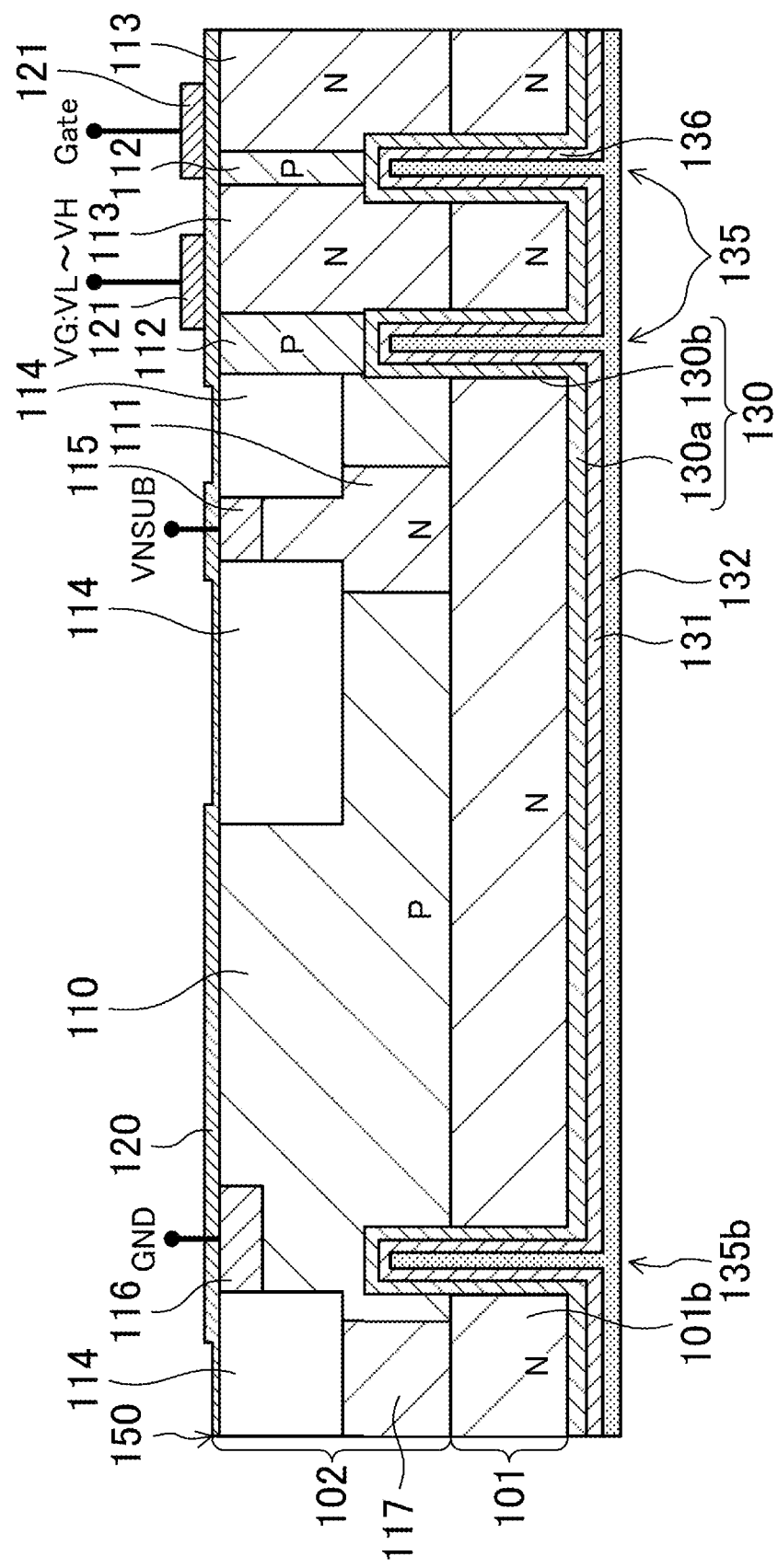
FIG. 7 is a schematic cross-sectional view of a solid-state imaging device according to a fourth embodiment.

FIG. 7 is a schematic cross-sectional view of an exemplary solid-state imaging device 100*d* according to a fourth embodiment. Unlike the solid-state imaging device 100*c* of FIG. 5, the solid-state imaging device 100*d* includes, in the element layer 102, an end N-type well region 117 near the chip end 150. The end N-type well region 117 reaches the N-type semiconductor layer 101. In this configuration, the p-n junctions at the chip end 150 (or the diced surface) are reduced to only one p-n junction between the N-type semiconductor layer 101 and the hole inducing layer 130*a*, which further reduces leakage currents.

Figure 8:
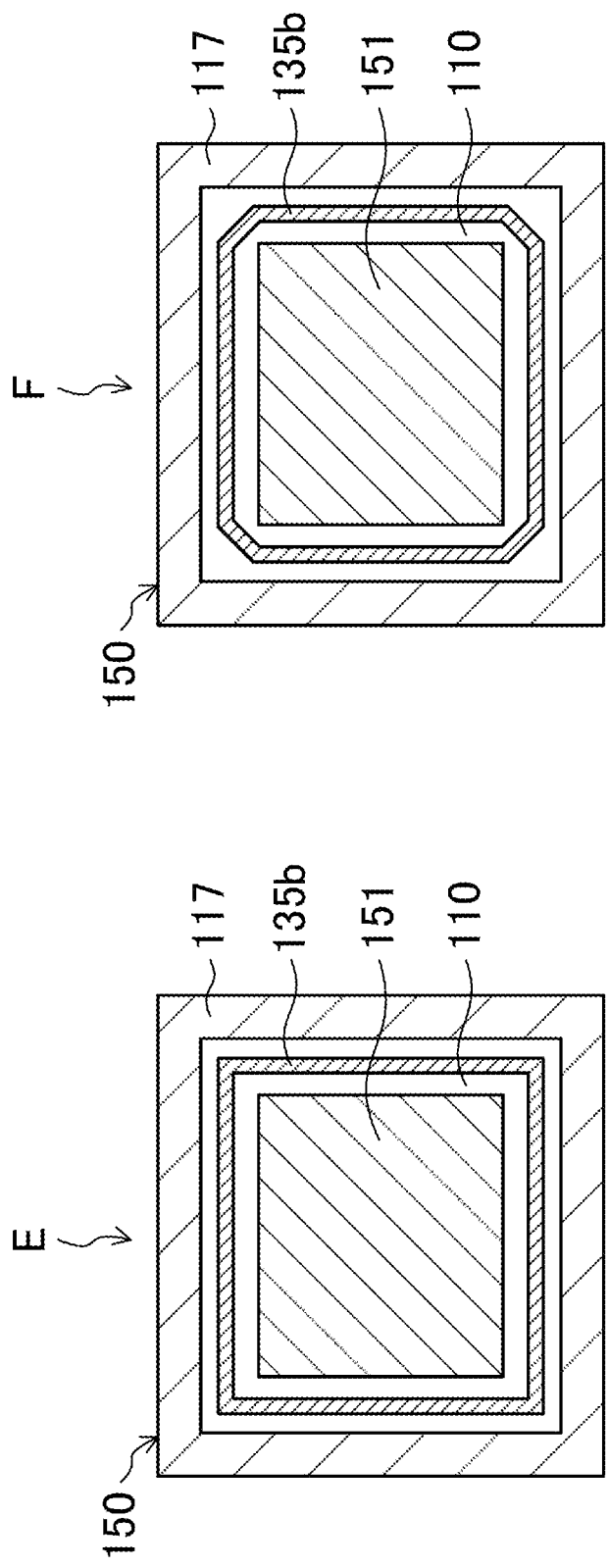
FIG. 8 includes plan views schematically illustrating shapes of an end n-type well region and a near-edge DTI region in the solid-state imaging device in FIG. 7.

FIG. 8 shows, as a plan view, the end N-type well region 117 near the chip end 150, the P-type well region 110 inside the end N-type well region 117, the near-edge DTI region 135*b* inside the P-type well region 110 and along the chip end 150, and the internal circuit region 151 more inward than the near-edge DTI region 135*b*. In a variation, the near-edge DTI region 135*b* may bend at an obtuse angle (135° here) as in the planar configuration B of FIG. 4. This is shown as a planar configuration F of FIG. 8.

The configuration with fewer p-n junctions using the N-type well region in the element layer 102 so as to reach the N-type semiconductor layer 101 is applicable to a region other than the vicinity of the chip end 150. For example, an N-type well region as described above may be formed around the via 140 shown in FIG. 3 (not shown). This configuration can reduce the number of the p-n junctions around the via 140 and reduce the leakage currents.

Fifth Embodiment

Figure 9:
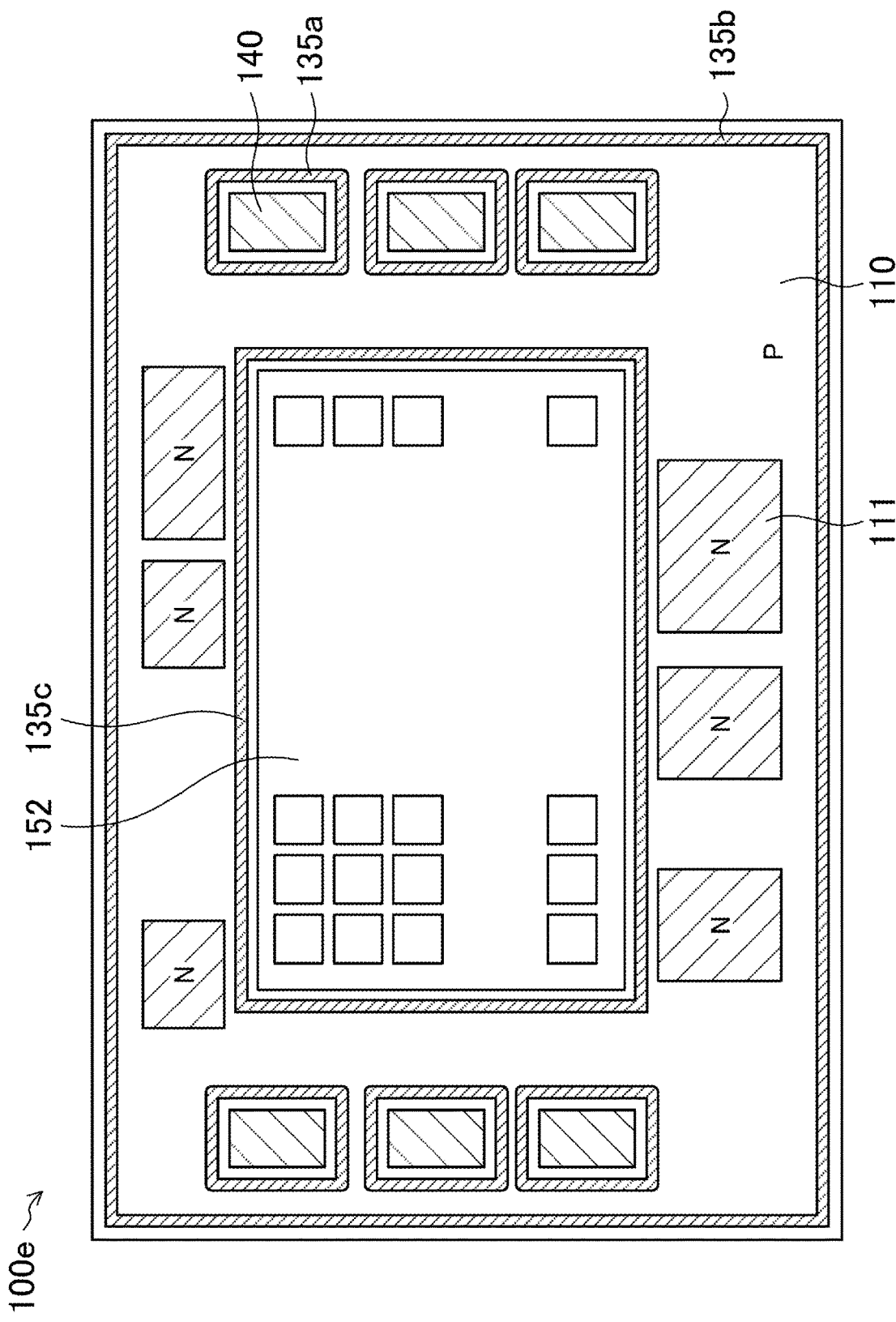
FIG. 9 is a plan view schematically illustrating a configuration of a solid-state imaging device according to a fifth embodiment.

FIG. 9 is a schematic plan view of an exemplary solid-state imaging device 100*e* according to a fifth embodiment. FIG. 9 shows the entire chip of the solid-state imaging device 100*e*.

In FIG. 9, a P-type well region 110, an N-type well region 111, and a via 140 are provided. As described in the second embodiment (FIGS. 3 and 4), the via 140 and the near-via DTI region 135*a* surrounding the via 140 are also provided. This configuration reduces leakage currents around the via 140. In addition, as described in the third embodiment (FIGS. 5 and 6), the near-edge DTI region 135*b* is provided along the chip end 150. This configuration reduces leakage currents near the chip end 150.

The solid-state imaging device 100*e* includes, around the center of the chip, a pixel array 152 where a plurality of unit pixels are arranged in a matrix. An annular near-array DTI region 135*c* surrounds the pixel array 152. The near-array DTI region 135*c* has the same or similar structure to that of the DTI region 135 shown in FIG. 1, for example.

The inside of the pixel array 152 can be electrically isolated from the periphery, using the P-type well region 110 and the near-array DTI region 135*c*. It is therefore possible to reduce effects of noise of a peripheral circuit on the pixel array 152, for example.

Sixth Embodiment

Next, a method of manufacturing a solid-state imaging device will be described as a sixth embodiment. In particular, a method of manufacturing the DTI region 135 will be described in detail. FIGS. 10 to 17 are diagrams for explaining the method of manufacturing the solid-state imaging device according to the present disclosure. In these figures, the solid-state imaging device is shown upside down with respect to FIG. 1 and other figures.

Figure 10:
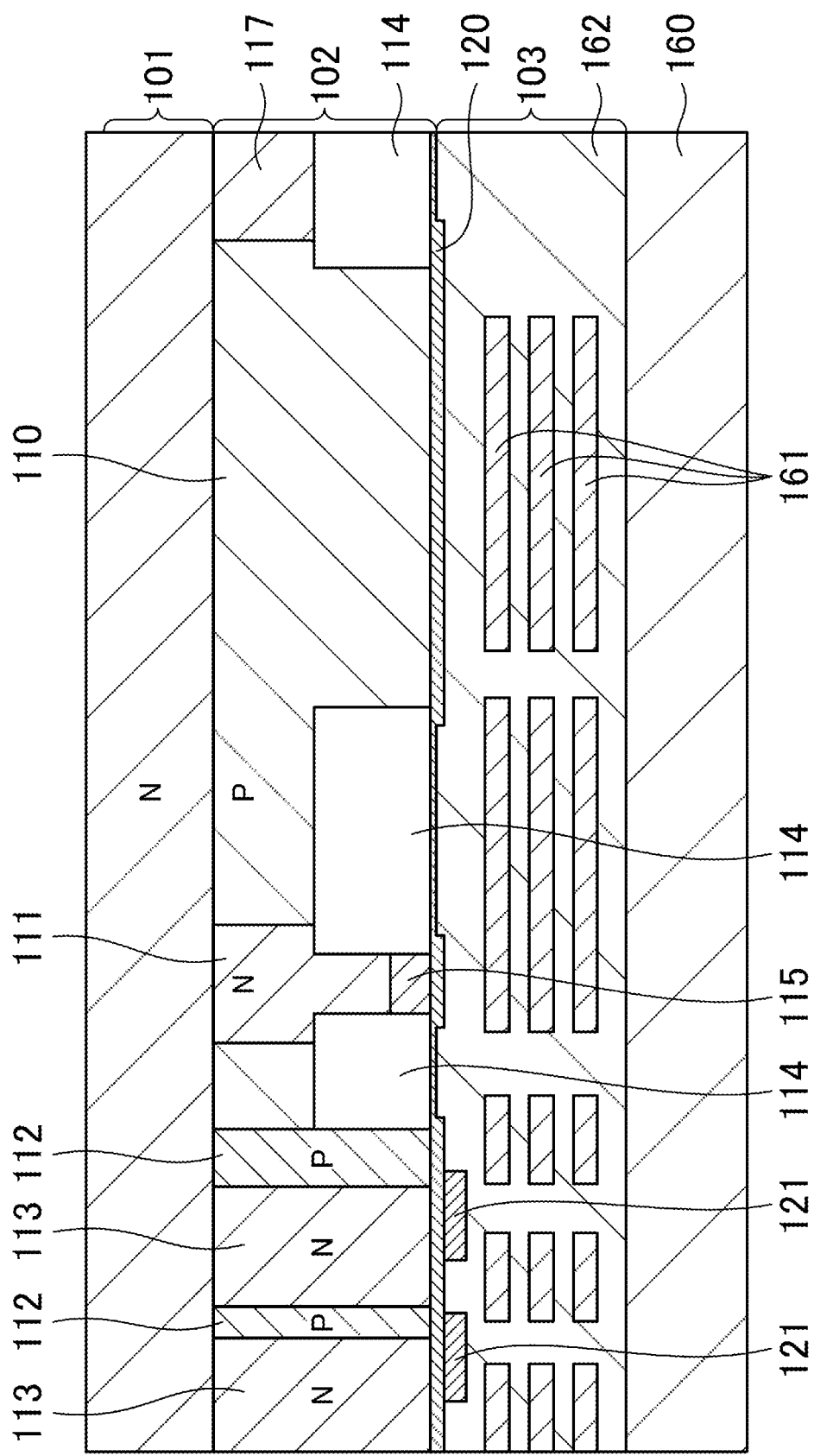
FIG. 10 is a diagram for explaining a method of manufacturing a solid-state imaging device according to the present disclosure.

FIG. 10 shows a stage before forming the DTI region 135. In order to obtain this structure, first, the N-type epitaxial layer is formed on the N-type semiconductor substrate. By impurity injection or other means, the P-type well region 110, the N-type well region 111, the P-type layer 112, the N-type photodiodes 113, and other elements are formed in the upper region of the epitaxial layer. The STI regions 114 are also formed. Accordingly, the pixel array 152 including the photoelectric conversion element, the active element, and other elements is formed so that the epitaxial layer serves as the element layer 102. The region of the N-type epitaxial layer under the element layer 102 serves as the N-type semiconductor layer 101.

Subsequently, the interconnect layer 103 obtained by embedding a plurality of interconnects 161 in an insulating layer 162 is formed on the element layer 102. Further, another wafer is, as a support substrate 160, bonded onto the interconnect layer 103. Next, the initially used N-type semiconductor substrate is thinned and removed. As necessary, the N-type semiconductor layer 101 may also be thinned to have a predetermined thickness. FIG. 10 shows this state with the support substrate 160 located below.

Figure 11:
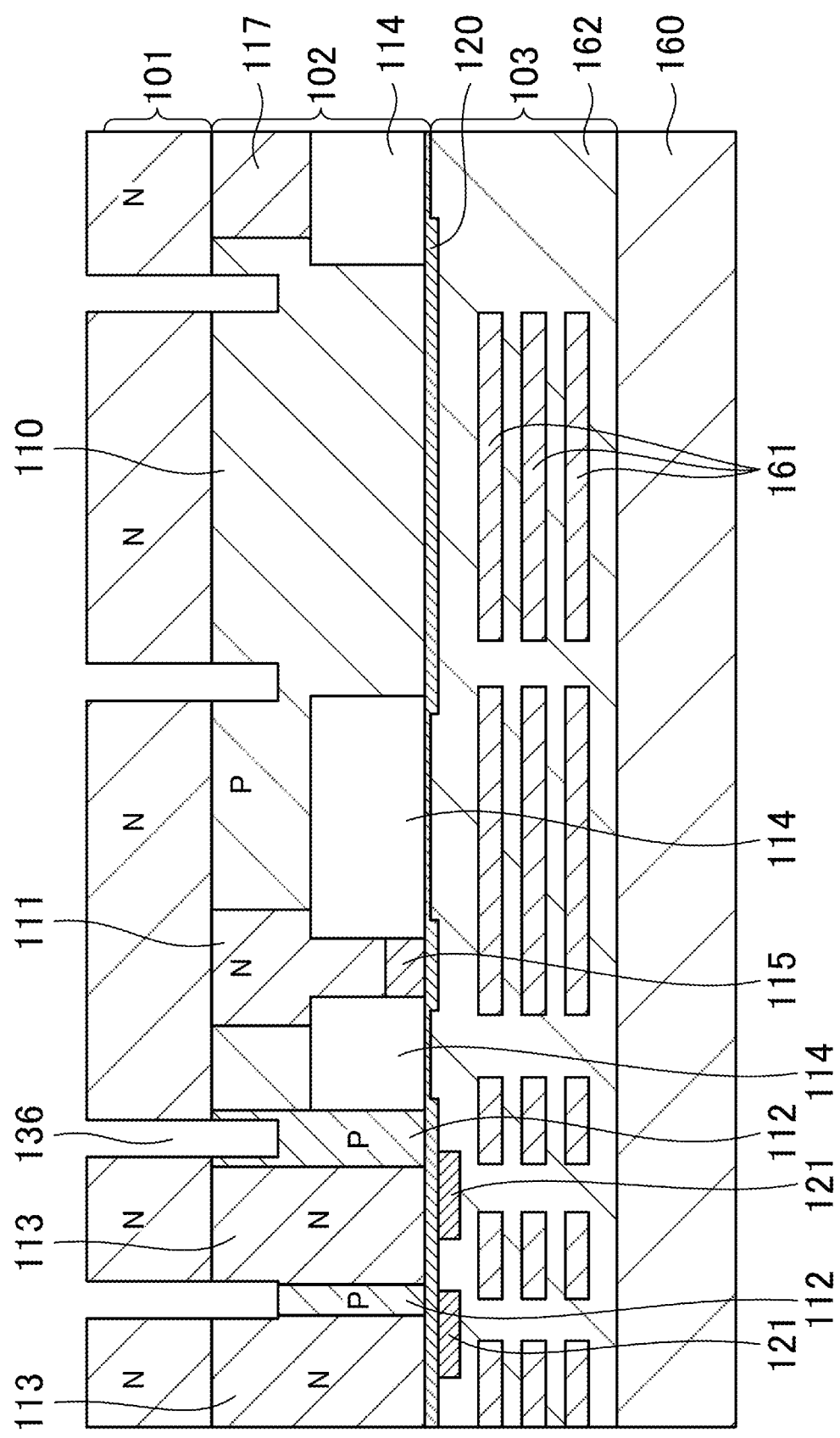
FIG. 11 is a diagram for explaining the method of manufacturing the solid-state imaging device according to the present disclosure, following FIG. 10.

Next, the step shown in FIG. 11 is performed. Here, a trench 136 for forming the DTI region 135 is formed. The trench 136 is formed to penetrate the N-type semiconductor layer 101 and to cut part of the element layer 102. For example, a mask having an opening at a predetermined position may be provided by lithography, and the trench 136 may be formed by etching to a necessary depth using the mask.

Figure 12:
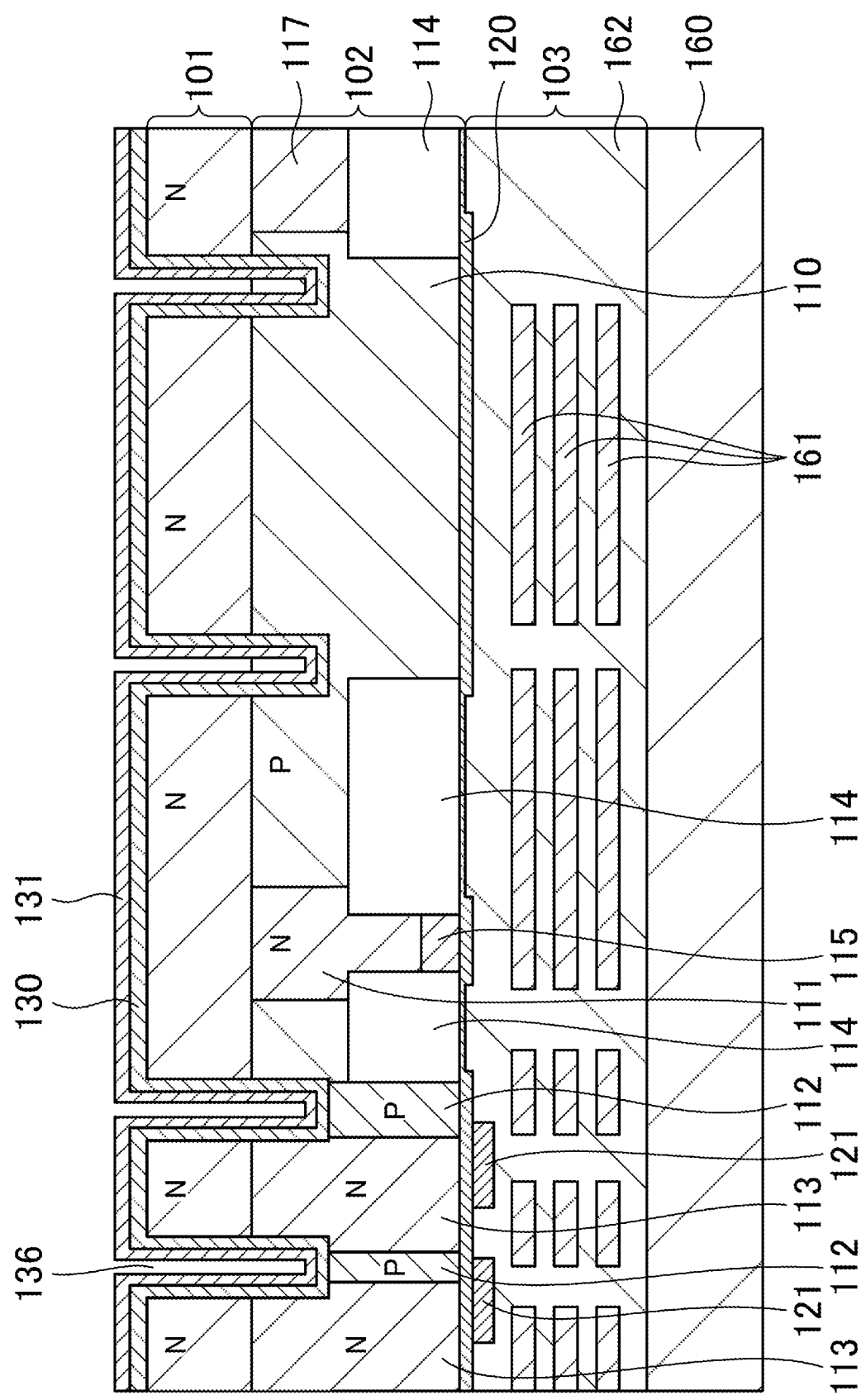
FIG. 12 is a diagram for explaining the method of manufacturing the solid-state imaging device according to the present disclosure, following FIG. 11.

Next, the step shown in FIG. 12 is performed. Here, the metal oxide film 131 is formed to cover the bottom and sidewalls of the trench 136 and cover the N-type semiconductor layer 101 (the surface opposite to the element layer 102). At this time, the trench 136 is not filled completely, and a space is left. The metal oxide film 131 is specifically a $HfO_2$ film or an $Al_2O_3$ film formed by a method such as chemical vapor deposition (CVD).

Once the metal oxide film 131 is formed, holes are induced and stored in contact portions of the N-type semiconductor layer 101 and the element layer 102 with the metal oxide film 131, thereby forming the P-type hole storage layer 130. Accordingly, the metal oxide film 131 covers the inside of the trench 136 and the N-type semiconductor layer 101, with the hole storage layer 130 interposed therebetween.

Figure 13:
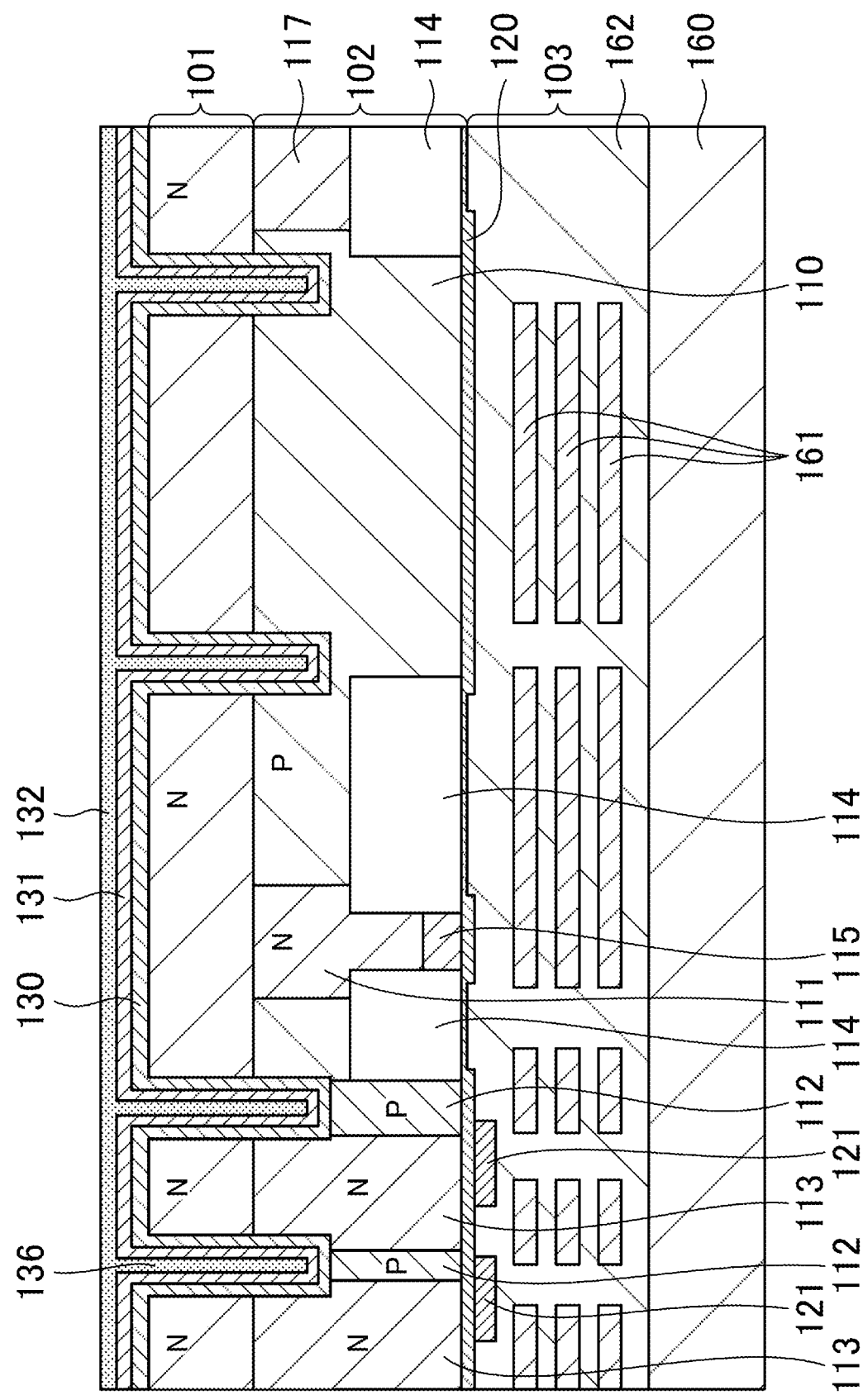
FIG. 13 is a diagram for explaining the method of manufacturing the solid-state imaging device according to the present disclosure, following FIG. 12.

Next, the step in FIG. 13 will be described. Here, the first insulating film 132 is formed to fill the space left in the trench 136 and cover the metal oxide film 131 outside the trench 136. For example, the first insulating film 132 may be made of an oxide film and formed by a method such as CVD. The DTI region 135 is formed in this manner.

Figure 14:
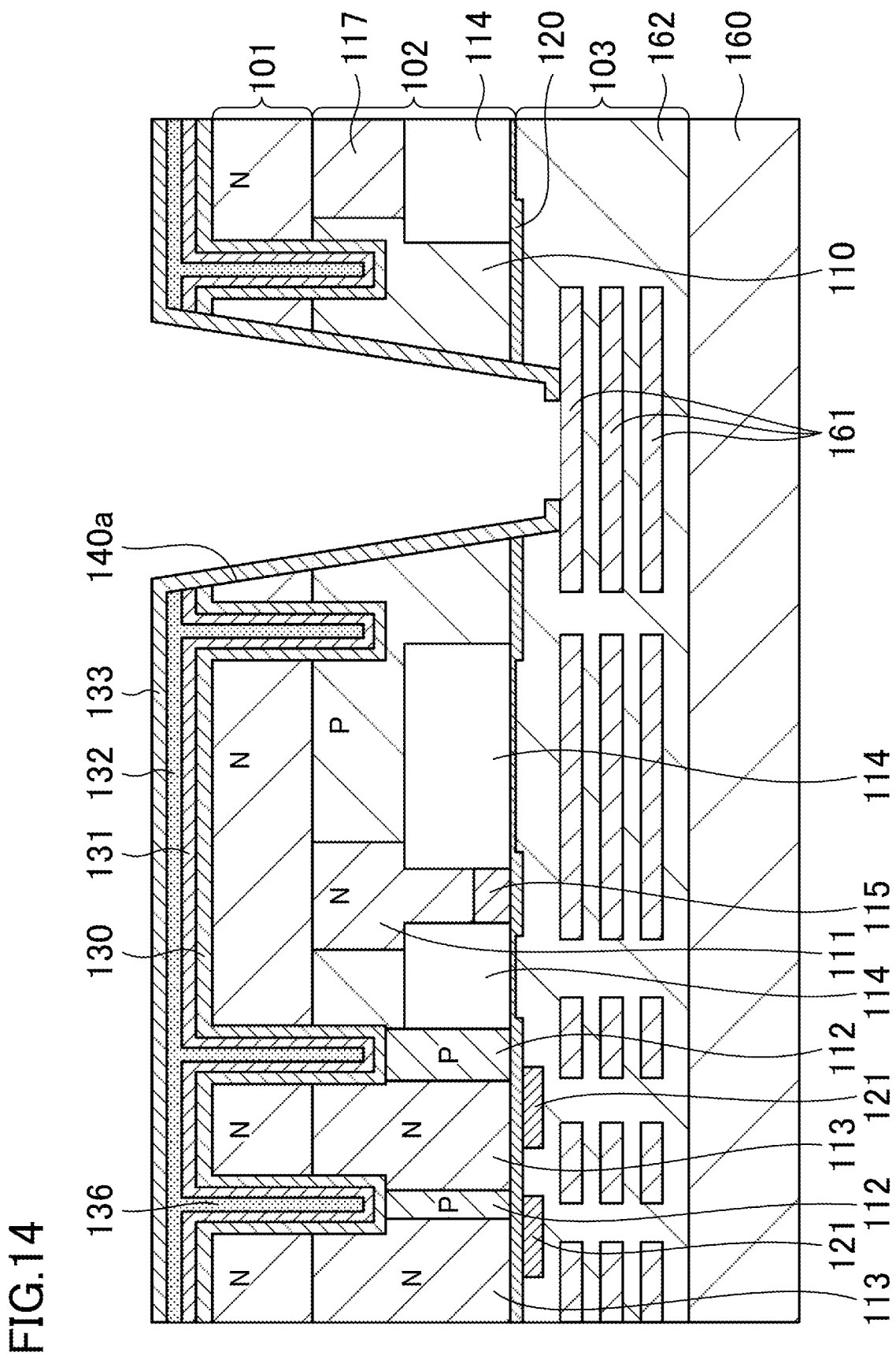
FIG. 14 is a diagram for explaining the method of manufacturing the solid-state imaging device according to the present disclosure, following FIG. 13.

Next, the step in FIG. 14 will be described. Here, a through-hole 140a for forming the via 140 is formed. The through-hole 140a is formed to penetrate the N-type semiconductor layer 101 and the element layer 102 and partially cut the first insulating film 132 and the insulating layer 162 of the interconnect layer 103 to reach one of the interconnects 161. For this purpose, etching or other processing may be performed, for example. The interconnect 161 reached by the through-hole 140a corresponds to the copper interconnect 122 in FIG. 1.

The second insulating film 133 is formed to cover the sidewalls and the bottom surface of the through-hole 140a and cover the first insulating film 132 outside the through-hole 140a. After that, the second insulating film 133 is partially removed at the bottom of the through-hole 140a to expose the one of the interconnects 161.

Figure 15:
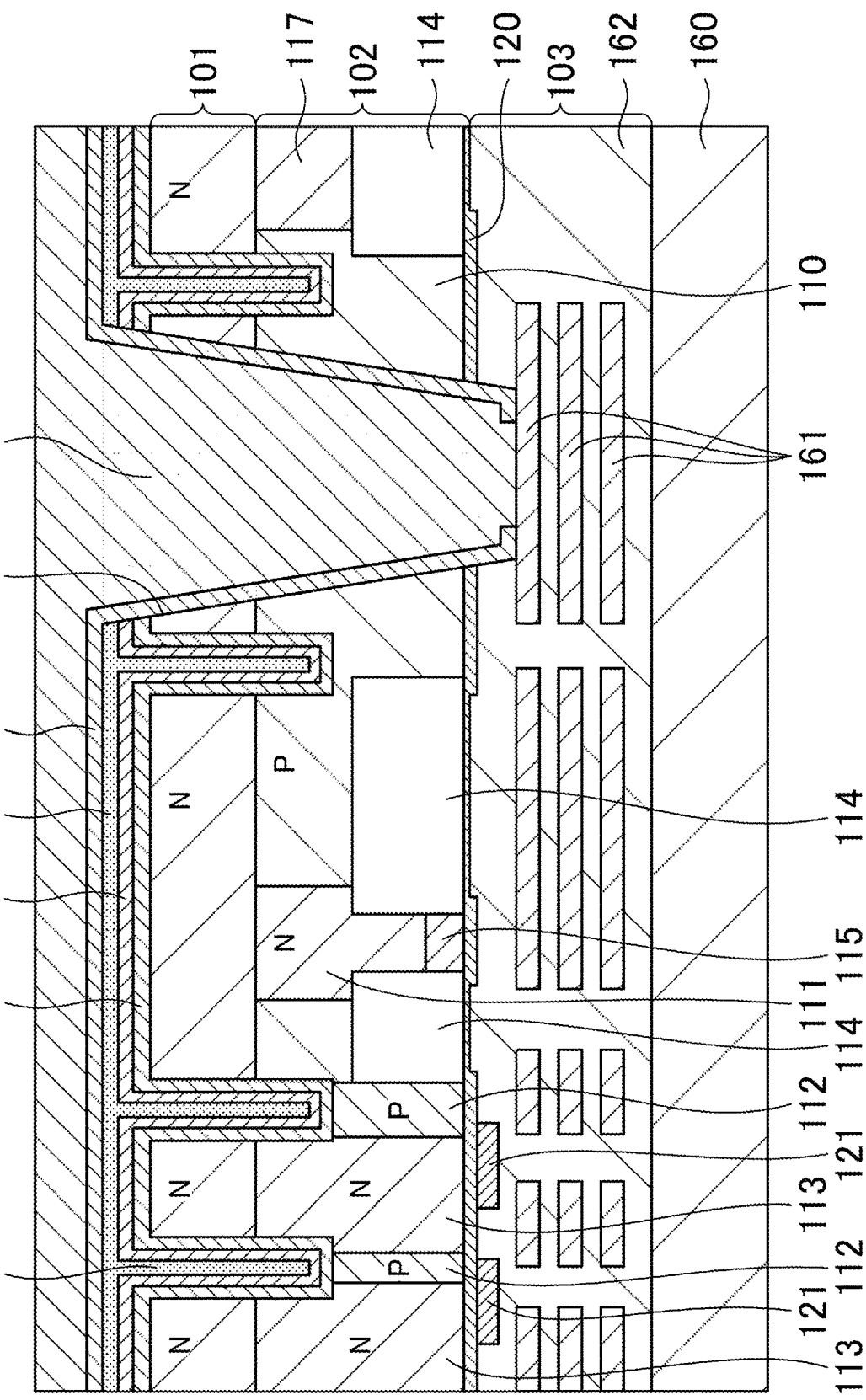
FIG. 15 is a diagram for explaining the method of manufacturing the solid-state imaging device according to the present disclosure, following FIG. 14.

Next, the step in FIG. 15 will be described. Here, in order to form the via 140, a copper layer 140b is formed to fill the inside of the through-hole 140a. The copper layer 140b is formed to cover the second insulating film also outside the through-hole 140a. The copper layer 140b may be formed by plating, for example.

Figure 16:
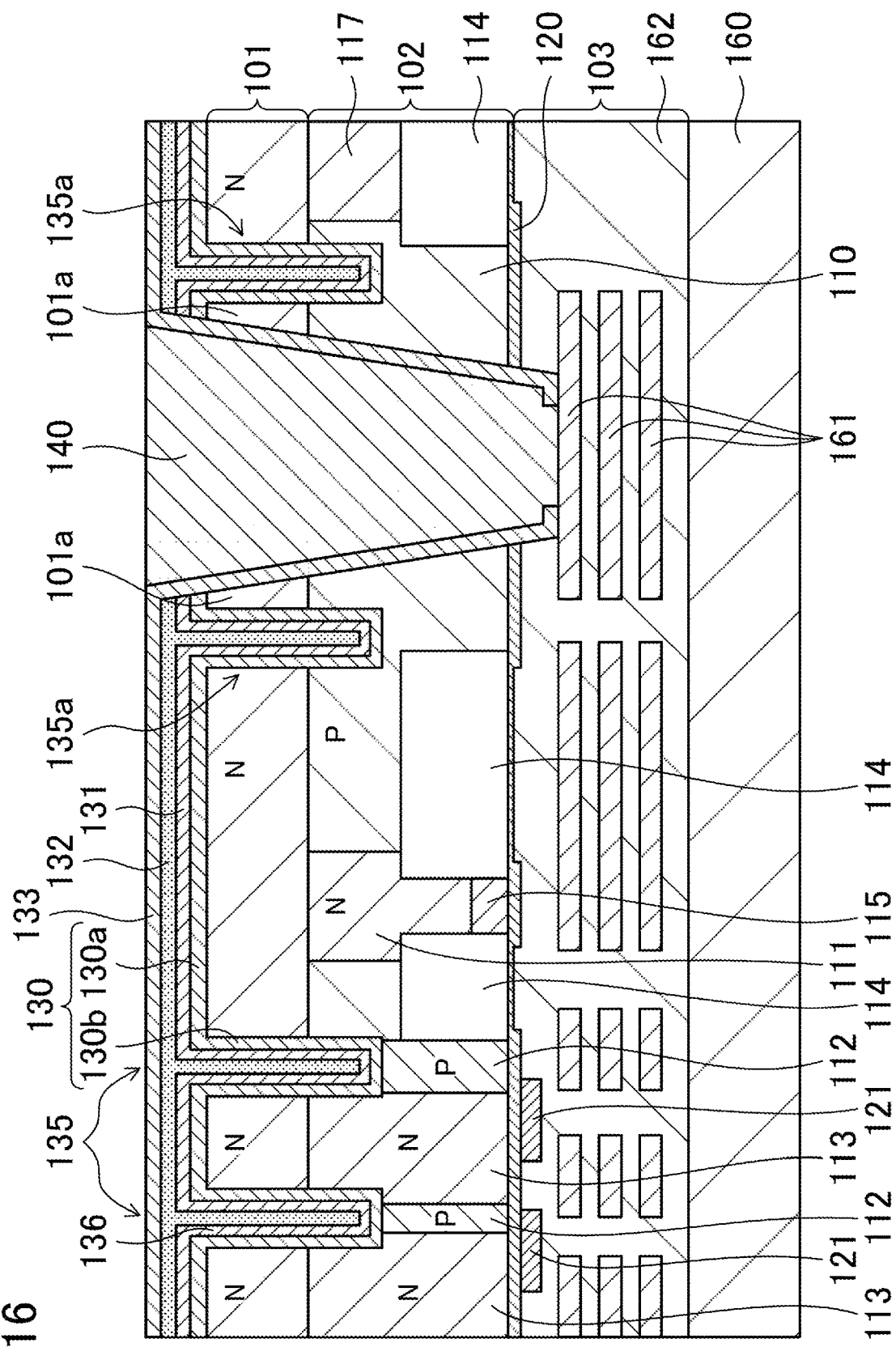
FIG. 16 is a diagram for explaining the method of manufacturing the solid-state imaging device according to the present disclosure, following FIG. 15.

Next, the step in FIG. 16 will be described. Here, the copper layer 140b outside the through-hole 140a is removed. For this, chemical mechanical polishing (CMP) may be used, for example. The via 140 obtained by filling the through-hole 140a with the copper layer 140b with the second insulating film 133 interposed therebetween is formed in this manner.

Figure 17:
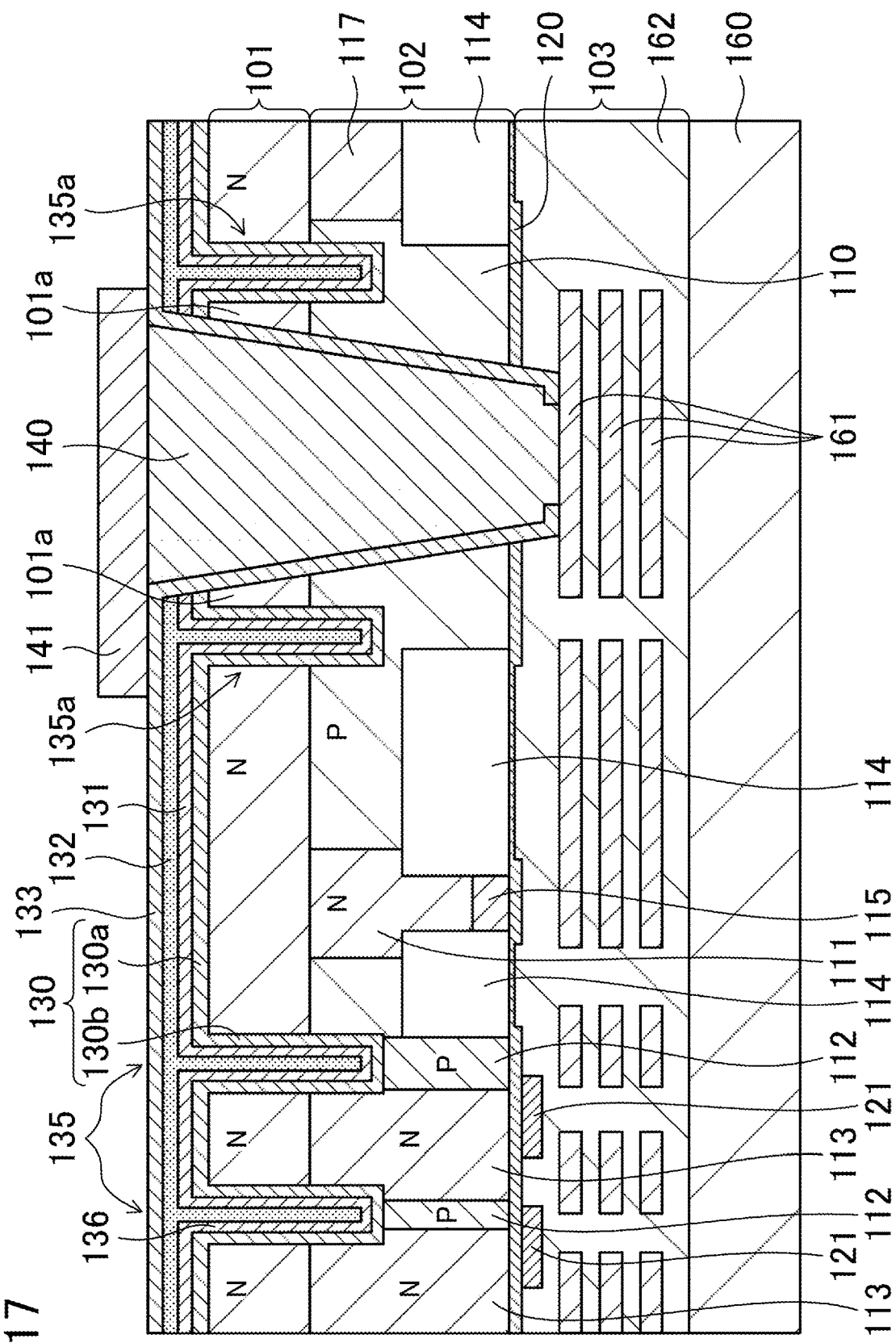
FIG. 17 is a diagram for explaining the method of manufacturing the solid-state imaging device according to the present disclosure, following FIG. 16.

Next, the step in FIG. 17 will be described. Here, the electrode pad 141 connected to the via 140 is formed on the side closer to the N-type semiconductor layer 101. The electrode pad 141 may be made of aluminum, for example.

The solid-state imaging device according to the present disclosure is manufactured in this manner. The materials, manufacturing method, shapes, and other features described above are mere examples, and the technique according to the present disclosure is not limited thereto.

INDUSTRIAL APPLICABILITY

The solid-state imaging device according to the present disclosure reduces an increase in a dark current even with an increase in the thickness of the semiconductor layer, and is thus useful as a solid-state imaging device with an improved infrared sensitivity.

DESCRIPTION OF REFERENCE CHARACTERS

100 Solid-State Imaging Device
100a to 100e Solid-State Imaging Device
101 N-Type Semiconductor Layer
101a N-Type Semiconductor Layer
101b N-Type Semiconductor Layer
102 Element Layer
103 Interconnect Layer
110 P-Type Well Region
111 N-Type Well Region
112 P-Type Layer
113 Photodiode
114 STI
115 High-Concentration N-Type Layer
116 High-Concentration P-Type Layer
117 End N-Well Region
120 On-Element Insulating film
121 Electrode
122 Copper Interconnect
130 Hole Storage Layer
130a First Hole Storage Layer
130b Second Hole Storage Layer
131 Metal Oxide Film
132 First Insulating Film
133 Second Insulating Film
135 DTI Region
135a Near-Via DTI Region
135b Near-Edge DTI Region
135c Near-Array DTI Region 136 Trench
140 Via
140a Through-Hole
140b Copper Layer
141 Electrode Pad
150 Chip End
151 Internal Circuit Region
152 Pixel Array
160 Support Substrate
161 Interconnect
162 Insulating Layer

The invention claimed is:

1. A solid-state imaging device including a pixel array of a plurality of unit pixels,
   each of the plurality of unit pixels including a photoelectric conversion element that generates a signal charge by photoelectric conversion, and an active element that converts the signal charge into an electric signal and outputs the electric signal, the solid-state imaging device comprising:
   an N-type semiconductor layer;
   an element layer stacked on the semiconductor layer and including the photoelectric conversion element and the active element;
   an interconnect layer stacked on the element layer and providing an interconnect for the active element; and
   an element isolation trench penetrating the semiconductor layer, wherein
   the element layer includes a P-type region and an N-type region,
   a first hole storage layer is formed on a surface of the semiconductor layer on a side opposite to the element layer,
   a second hole storage layer is formed in contact portions of the semiconductor layer and the element layer with the element isolation trench,
   the P-type region of the element layer and the first hole storage layer are connected to each other by the second hole storage layer,
   the solid-state imaging device is configured as a semiconductor chip,
   the element isolation trench includes, at a peripheral edge of the semiconductor chip, a near-edge element isolation trench that is continuous along an outer peripheral end, and
   the near-edge element isolation trench has a polygonal shape with an obtuse angle in a plan view.

2. A solid-state imaging device including a pixel array of a plurality of unit pixels,
   each of the plurality of unit pixels including a photoelectric conversion element that generates a signal charge by photoelectric conversion, and an active element that converts the signal charge into an electric signal and outputs the electric signal, the solid-state imaging device comprising:
   an N-type semiconductor layer;
   an element layer stacked on the semiconductor layer and including the photoelectric conversion element and the active element;
   an interconnect layer stacked on the element layer and providing an interconnect for the active element; and
   an element isolation trench penetrating the semiconductor layer, wherein
   the element layer includes a P-type region and an N-type region,
   a first hole storage layer is formed on a surface of the semiconductor layer on a side opposite to the element layer,
   a second hole storage layer is formed in contact portions of the semiconductor layer and the element layer with the element isolation trench,
   the P-type region of the element layer and the first hole storage layer are connected to each other by the second hole storage layer,
   a P-type well region is formed on a periphery of the pixel array,
   the element isolation trench includes a near-array element isolation trench formed in the P-type well region and surrounding the pixel array, and
   the near-array element isolation trench surrounds the pixel array, in a polygonal shape with an obtuse angle in a plan view.

* * * * *